(12) United States Patent
Tanaka et al.

(10) Patent No.: US 6,197,479 B1
(45) Date of Patent: *Mar. 6, 2001

(54) PHOTOSENSITIVE RESIN COMPOSITION, METHOD FOR PRODUCING PHOTOSENSITIVE RESIN COMPOSITION, AND PRINTING PLATE MATERIAL

(75) Inventors: Shinji Tanaka; Katsutoshi Sasashita; Masanao Isono, all of Okazaki (JP)

(73) Assignee: Toray Industries, Inc. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/338,102

(22) Filed: Jun. 23, 1999

(30) Foreign Application Priority Data

Jun. 26, 1998 (JP) .................................................. 10-180917

(51) Int. Cl.$^7$ ...................................................... G03C 1/73
(52) U.S. Cl. .................................... 430/281.1; 430/286.1; 430/913
(58) Field of Search ............................. 430/270.1, 281.1, 430/286.1, 913

(56) References Cited

U.S. PATENT DOCUMENTS

| | | | |
|---|---|---|---|
| 2,948,611 | 8/1960 | Kelsall et al. | 430/281.1 |
| 3,024,180 | 3/1962 | McGraw | 430/281.1 |
| 3,941,727 | * 3/1976 | Timmerman et al. | 206/8 |
| 3,953,386 | * 4/1976 | Murphy et al. | 260/17 A |
| 4,272,608 | 6/1981 | Proskow | 430/288 |
| 4,275,142 | 6/1981 | Hosaka et al. | 430/271.1 |
| 4,517,279 | 5/1985 | Worns | 430/286.1 |
| 5,229,434 | 7/1993 | Fukuchi | 522/110 |
| 5,348,844 | 9/1994 | Garmong | 430/286.1 |
| 5,350,661 | 9/1994 | Barney | 430/271.1 |
| 5,372,913 | 12/1994 | Nanpei et al. | 430/281.1 |
| 5,424,172 | 6/1995 | Nampei et al. | 430/281.1 |
| 5,707,773 | * 1/1998 | Grossman et al. | 430/286.1 |
| 5,916,732 | * 6/1999 | Sasashita et al. | 430/287.1 |

FOREIGN PATENT DOCUMENTS

| | | |
|---|---|---|
| 0 261 910 | 3/1988 | (EP) . |
| 0 489 553 | 6/1992 | (EP) . |
| 51-43374 | 4/1976 | (JP) . |
| 51-63903 | 6/1976 | (JP) . |
| 53-10648 | 1/1978 | (JP) . |
| 61-22339 | 1/1986 | (JP) . |
| 5-6178 | 1/1993 | (JP) . |

* cited by examiner

Primary Examiner—Janet Baxter
Assistant Examiner—Yvette M. Clarke
(74) Attorney, Agent, or Firm—Austin R. Miller

(57) ABSTRACT

A photosensitive resin composition comprising (A) a polymer as derived from its latex dispersion in water, (B) a hydrophilic photopolymerizable monomer, (C) rubber, and (D) a photopolymerization initiator, especially that as prepared by mixing (A') a latex dispersion in water and (B) a hydrophilic photopolymerizable monomer to give a component (E), followed by kneading under heat the resulting component (E) with (C) rubber and (D) a photopolymerization initiator, can be developed with a developer not containing additives such as surfactants and alkali metal salts. The composition has good image reproducibility and is favorable to flexographic printing plates.

17 Claims, 1 Drawing Sheet

PHOTOSENSITIVE RESIN COMPOSITION, METHOD FOR PRODUCING PHOTOSENSITIVE RESIN COMPOSITION, AND PRINTING PLATE MATERIAL

BACKGROUND OF THE INVENTION

1. Field of the Invention

The present invention relates to a photosensitive resin composition for printing plates, and to a printing plate material comprising it. In particular, it relates to a water-developable, flexographic printing plate material.

2. Description of the Related Art

As having the advantage of elastomer characteristics, a photosensitive resin composition that comprises, as a carrier resin component, an elastomer of chlorinated rubber, styrene-butadiene block copolymer, polyurethane or the like and contains an ethylenically unsaturated compound and a photopolymerization initiator is useful as a flexographic printing plate material. Many proposals relating to it have been made, for example, as in U.S. Pat. No. 2,948,611, U.S. Pat. No. 3,024,180, JP-A-51-43374, etc.

Solid photographic resin materials for printing plates require development with halogenated hydrocarbons. It is desired to create water-developable, solid photographic resin materials for flexographic printing plates, and some proposals for them have been made.

In U.S. Pat. No. 4,517,279, U.S. Pat. No. 5,372,913 and U.S. Pat. No. 5,424,172, a method has been proposed which is to prepare a photosensitive resin composition containing a hydrophilic polymer such as carboxylated nitrile rubber and a hydrophobic polymer such as nitrile rubber. However, the composition proposed is problematic in that the aqueous developer for it must contain some additives, for example, like an aqueous alkaline developer or an aqueous, surfactant-containing developer, in order that the polymers in the composition could be dispersible in the developer.

In U.S. Pat. No. 4,275,142, U.S. Pat. No. 4,272,608, JP-A-51-63903, JP-A-53-10648 and JP-A-61-22339, a photosensitive resin composition comprising a carboxyl group-containing polymer has been proposed, in which the polymer is in the form of a metal salt or ammonium salt. However, the composition proposed is still problematic in that it is liquid, that its waterproofness and mechanical strength are unsatisfactory when used in printing plates, and that the aqueous developer for it must contain some additives, for example, like an aqueous alkaline developer or an aqueous, surfactant-containing developer.

For forming salt structures as in the above, another method has been proposed in U.S. Pat. No. 5,348,844, U.S. Pat. No. 5,350,661, U.S. Pat. No. 5,229,434 and JP-B-5-6178, which comprises forming ammonium salt structures of a carboxyl group-containing polymer of being in the form of latex or micro-gel particles dispersed in water. They say that the composition comprising the polymeric ammonium salt is developable with water and exhibits good waterproofness when used in printing plates. However, the composition is still problematic in that its printing durability in flexography is poor, and that, since it contains intragranularly-crosslinked particles, the gel particles still remain as they are in the composition or drop away from the composition after and during its development with an aqueous developer, thereby roughening the relief edges as formed after the development. Specifically, the image reproducibility of the composition for fine relief patterns is poor.

SUMMARY OF THE INVENTION

An object of the invention is to provide a photosensitive resin composition for flexographic printing plates with good image reproducibility, which can be developed with a developer not containing additives such as surfactants, alkali metal salts and others.

The photosensitive resin composition of the invention comprises:

(A) a polymer as derived from its latex dispersion in water, (B) a hydrophilic photopolymerizable monomer, (C) rubber, and (D) a photopolymerization initiator.

In one preferred embodiment of the composition, the polymer (A) as derived from its latex dispersion in water is dispersed in the hydrophilic photopolymerizable monomer (B).

The invention also provides a method for producing the photosensitive resin composition, which comprises:

mixing (A') a latex dispersion in water and (B) a hydrophilic photopolymerizable monomer to give a component (E), followed by kneading the resulting component (E) with (C) rubber and (D) a photopolymerization initiator to give the composition.

The invention further provides a printing plate material, which comprises:

a photosensitive layer as formed on a support by applying a photosensitive resin composition comprising (A) a polymer as derived from its latex dispersion in water, (B) a hydrophilic photopolymerizable monomer, (C) rubber and (D) a photopolymerization initiator onto the support.

BRIEF DESCRIPTION OF THE DRAWING

The sole FIGURE shows a TEM (transmission electron microscope) image (×40,000) of an exposed sample of the photosensitive resin composition of the invention as prepared in Example 7.

DESCRIPTION OF THE PREFERRED EMBODIMENTS

Figure 1:
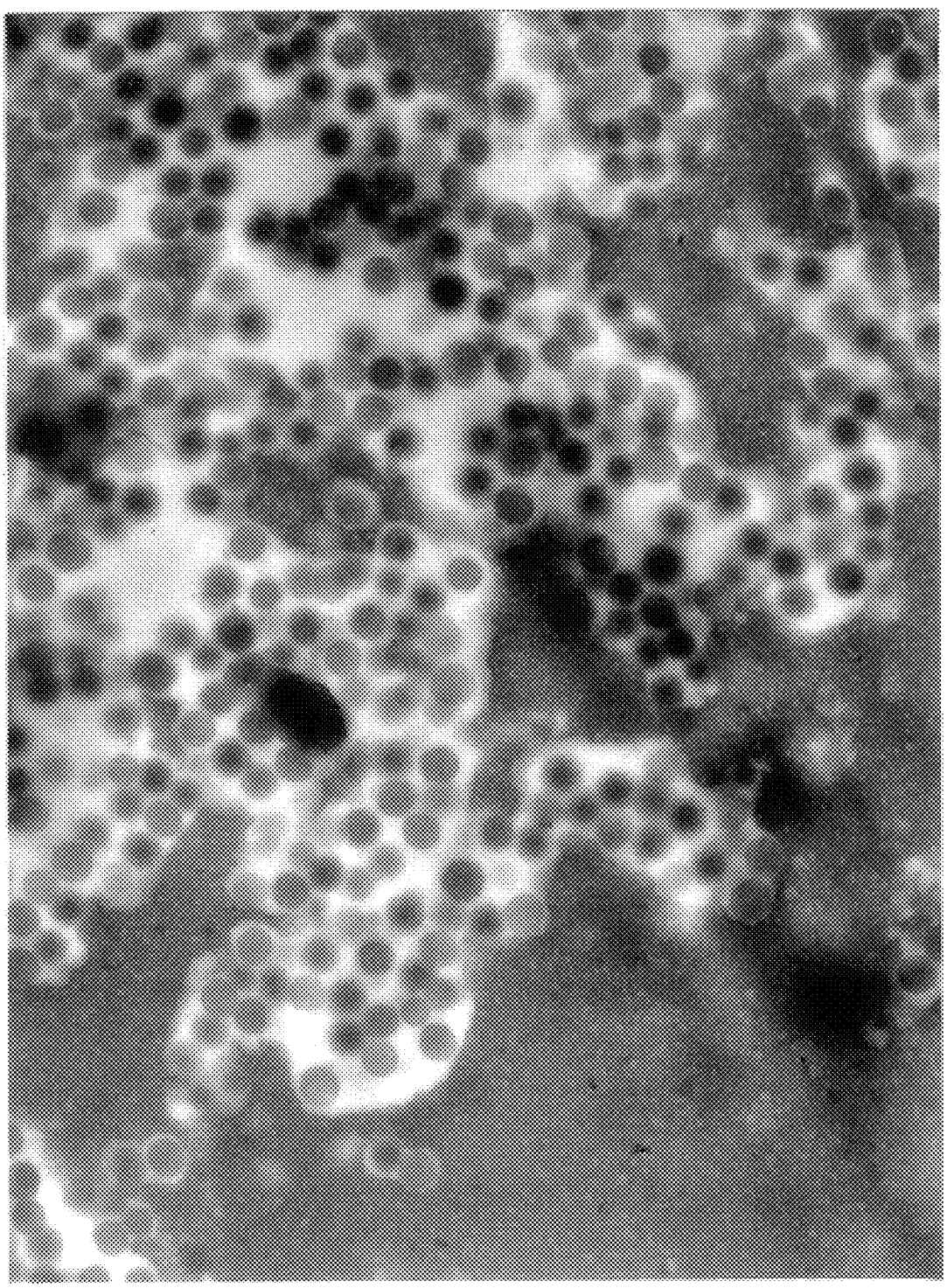

Embodiments of the invention are described below.

The component (A), polymer to be in the photosensitive resin composition of the invention is derived from its latex dispersion in water. In the polymer latex dispersion in water, the latex polymer particles are dispersed in water owing to their electric repulsion, and they are electrically charged in water through the ionization of emulsifier, protective colloid, polymer and others therein and through the adsorption of the particles of those components to each other. The polymer (A) indicates the latex polymer particles being dispersed in water in that condition.

The polymer as derived from its latex dispersion in water has the property of forming a continuous film after water around it evaporates away. Even though derived from its latex dispersion in water, the polymer having a high intragranular crosslinking density could hardly form a continuous film. Therefore, in the invention, it is desirable that the polymer particles are not intragranularly crosslinked or, even though being intragranularly crosslinked in some degree, they have a low intragranular crosslinking density.

Concretely, herein usable are aqueous dispersions of latex polymers such as polybutadiene latex, natural rubber latex, styrene-butadiene copolymer latex, acrylonitrile-butadiene copolymer latex, polychloroprene latex, polyisoprene latex, polyurethane latex, methyl methacrylate-butadiene copolymer latex, vinylpyridine polymer latex, butyl polymer latex, thiokol polymer latex, acrylate polymer latex, as well as those of latex copolymers of those polymers as copolymerized with any other components such as acrylic acid, methacrylic acid and the like. Of those, preferred are aqueous dispersions of latex polymers having a butadiene or isoprene skeleton in the molecular chain, in view of the hardness of the cured polymers. Concretely, preferred are polybutadiene latex, styrene-butadiene copolymer latex, acrylonitrile-butadiene copolymer latex, methyl methacrylate-butadiene copolymer latex, and polyisoprene latex.

The component (B) for use in the invention acts to prevent the aggregation of the component (A). Specifically, a film of the component (B) is formed around the surfaces of the particles of the component (A), whereby the aggregation of the particles of the component (A) is retarded.

As the component (B) having an ability to prevent the aggregation of the component (A), herein used is a hydrophilic monomer. The hydrophilic monomer for use in the invention is meant to include compounds having an ethylenically unsaturated bond and having a specific molecular structure to be mentioned below.

The specific molecular structure which the hydrophilic monomer for use in the invention shall have includes a polyalkylene glycol structure, a carboxyl group-containing structure, a hydroxyl group-containing structure and a phosphoric acid group-containing structure.

As specific examples of the polyalkylene glycol-containing monomers, mentioned are polyethylene glycol di(meth)acrylates such as diethylene glycol di(meth)acrylate, triethylene glycol di(meth)acrylate, tetraethylene glycol di(meth)acrylate, etc.; polypropylene glycol di(meth)acrylates such as dipropylene glycol dimethacrylate, tripropylene glycol di(meth)acrylate, tetrapropylene glycol di(meth)acrylate, etc.; phenoxypolyethylene glycol(meth)acrylates such as phenoxydiethylene glycol(meth)acrylate, phenoxytriethylene glycol(meth)acrylate, phenoxytetraethylene glycol(meth)acrylate, phenoxypentaethylene glycol (meth)acrylate, etc.; phenoxypolypropylene glycol(meth)acrylates such as phenoxydipropylene glycol(meth)acrylate, phenoxytripropylene glycol(meth)acrylate, phenoxytetrapropylene glycol(meth)acrylate, etc.; as well as other monomers of polyethylene glycol-polypropylene glycol di(meth)acrylate, cresylpolyethylene glycol(meth)acrylate, nonylphenoxypolyethylene glycol(meth)acrylate, etc.

The hydroxyl group-containing monomers include, for example, 2-hydroxyethyl(meth)acrylate, 2-hydroxypropyl (meth)acrylate, 2-hydroxybutyl(meth)acrylate, 3-chloro-2-hydroxypropyl(meth) acrylate, β-hydroxy-β'-(meth)acryloyloxyethyl phthalate, 2-hydroxy-3-acryloyloxypropyl (meth)acrylate, etc.

The carboxyl group-containing monomers include, for example, β-carboxyethyl(meth)acrylate, mono(meth)acryloyloxyethyl succinate, monohydroxyethyl phthalate (meth)acrylate, etc.

The phosphoric acid group-containing monomers include, for example, 2-(meth)acryloyloxy acid phosphate, tris (acryloyloxy)phosphate, caprolactone-modified 2-(meth)acryloyloxyethyl acid phosphate, -(meth)acryloyloxyethyl acid phosphate, diphenyl-2-(meth)acryloyloxyethyl phosphate, etc. The terminology, "(meth)acrylate" as referred to herein is meant to include "methacrylate" and "acrylate".

As in the above, the polyalkylene glycol-containing monomers, the carboxyl group-containing monomers, the hydroxyl group-containing monomers and the phosphoric acid group-containing monomers are preferred, as their ability to prevent the aggregation of the component (A) is high.

Preferably, the amount of the component (B) to be in the composition falls from 10 to 200 parts by weight, relative to 100 parts by weight of the component (A) therein. The composition in which the amount of the component (B) is 10 parts by weight or more is preferred, as having sufficient crosslinking density and good image reproducibility. The composition in which the amount of the component (B) is not more than 200 parts by weight is also preferred, since the relief patterns formed from it are tough and since the component (B) therein is not separated during storage.

If desired, the composition of the invention may contain a hydrophobic monomer not interfering with the effect of the invention. As a rule, hydrophobic monomers do not have a polar functional group.

Concretely, the hydrophobic monomer that may be in the composition includes alkyl (meth)acrylates such as methyl (meth)acrylate, ethyl(meth)acrylate, propyl(meth)acrylate, butyl(meth)acrylate, isoamyl(meth)acrylate, 2-ethylhexyl (meth)acrylate, lauryl(meth)acrylate, stearyl(meth)acrylate, etc.; cycloalkyl(meth)acrylates such as cyclohexyl(meth) acrylate, etc.; halogenated alkyl(meth)acrylates such as chloroethyl(meth)acrylate, chloropropyl(meth)acrylate, etc.; alkoxyalkyl(meth)acrylates such as methoxyethyl(meth) acrylate, ethoxyethyl(meth)acrylate, butoxyethyl(meth) acrylate, etc.; phenoxyalkyl(meth)acrylates such as phenoxyethyl(meth)acrylate, nonylphenoxyethyl(meth) acrylate, etc.

The amount of the hydrophobic monomer, if in the composition, is preferably not larger 200 parts by weight, relative to 100 parts by weight of the component (A) therein. If it is larger than 200 parts by weight, the water developability of the composition will lower and the composition could not form good relief patterns.

Rubber of the component (C) may be any ordinary rubber or elastomer well known in the art. Concretely, it includes butadiene rubber, nitrile rubber, acrylic rubber, epichlorohydrin rubber, urethane rubber, isoprene rubber, styrene-isoprene rubber, styrene-butadiene rubber, ethylene-propylene copolymer, polyethylene chloride, etc. If not containing the rubber component, the photosensitive resin composition could not have increased rubber elasticity and could not exhibit aqueous ink resistance.

The amount of the component (C) in the composition preferably falls from 20 to 300 parts by weight, relative to 100 parts by weight of the component (A) therein. The composition in which the amount of the component (C) is 20 parts by weight or more is preferred, since the printing plate comprising a layer of the composition has good waterproofness and since the resiliency of the printing plate is lowered so as not to worsen the printing capabilities thereof. The composition in which the amount of the component (C) is not more than 300 parts byweight is also preferred, since the composition could have good water developability.

Also preferably, the ratio by weight of the total of the component (A) and the component (B) to the component (C) is at least 1. The composition having the ratio of at least 1 is preferred, since its water development speed is high and the composition is well practicable.

The photosensitive resin composition of the invention contains a photopolymerization initiator as the component (D). The photopolymerization initiator may be any and every one having an ability to initiate photopolymerization of polymerizable carbon-carbon unsaturated groups. Above all, preferred are those capable of absorbing light to give a radical through autolysis or hydrogen desorption. For example, herein usable are benzoin alkyl ethers, benzophenones, anthraquinones, benzils, acetophenones, diacetyls, etc. Preferably, the amount of the photopolymerization initiator to be in the composition falls from 0.1 to 50 parts by weight, relative to 100 parts by weight of the component (A) therein.

The composition in which the amount of the photopolymerization initiator is 0.1 parts by weight or more is preferred, since the polymerization initiation efficiency of the composition is not lowered and the image reproducibility of the composition is good. The composition in which the amount of the photopolymerization initiator is not more than 50 parts by weight is also preferred, since the sensitivity of the composition is not too high and the exposure time for the composition is easy to control.

The photosensitive resin composition of the invention may optionally contain a plasticizer. The plasticizer is not specifically defined, so far as it has the property of softening printing plate materials. Preferably, however, the plasticizer for use in the invention shall have good compatibility with the polymer components (A) and (C). More preferred as the plasticizer are polyene compounds or ester bond-containing compounds that are liquid at room temperature. The polyene compounds that are liquid at room temperature include liquid polybutadiene and polyisoprene, and their terminal-modified or side chain-modified maleates and epoxidates. The ester bond-containing compounds include phthalates, phosphates, sebacates, adipates, and polyesters having a molecular weight of from 1,000 to 3,000.

The amount of the plasticizer, if in the composition, is preferably not larger than 100 parts by weight, relative to 100 parts by weight of the component (A) therein, in order that the solid plate comprising a layer of the composition could have satisfactory mechanical strength before it is subjected to photo-crosslinking treatment.

In order to enhance the thermal stability of the photosensitive resin composition of the invention, any known polymerization inhibitor may be added to the composition. As the polymerization inhibitor to be added to the composition, preferred are phenols, hydroquinones, catechols, etc. The amount of the polymerization inhibitor to be in the composition generally falls from 0.001 to 5% by weight of the total weight of the composition.

As other additives, the composition may further contain any of dyes, pigments, surfactants, defoaming agents, UV absorbents, flavors, etc.

In the photosensitive resin composition of the invention, it is desirable that the polymer (A) as derived from its latex dispersion in water is dispersed in the component (B), hydrophilic monomer. In that condition, the polymer particles (A) do not aggregate in the composition.

The morphology of the photosensitive resin composition can be observed with an electron microscope. Briefly, the composition is photo-cured through exposure to UV rays, and the cured block is sliced into thin sections having a thickness of about 200 µm. If desired, the sections are stained with osmate or phosphorus-tungsten lake, and observed with a transmission electron microscope to know the morphology of the composition.

In the method for producing the photosensitive resin composition of the invention, it is desirable to mix the component (A'), latex dispersion in water and the component (B) to prepare the component (E). In this stage, the particles of the component (A) adsorb the component (B), and do not aggregate.

The component (E) is kneaded with the component (C) and the component (D) in a kneading system under heat, with water being removed from the resulting mixture, to produce the photosensitive resin composition of the invention.

Alternatively, the component (E) is previously dewatered in a drying system, and then kneaded under heat with the component (C) and the component (D) in a kneading system such as an extruder or a kneader to produce the photosensitive resin composition. In view of its producibility, preferred is the method comprising the predrying step of dewatering the component (E) in a drying system.

The kneading system is not specifically defined. For example, employable are a double-screw extruder, a single-screw-extruder, a kneader, a Banbury mixer, etc.

The photosensitive resin composition is applied onto a support coated with an adhesive, through melt extrusion with an extruder, and a cover film coated with a sticking preventing layer is contacted with the photosensitive layer thus formed on the support to produce a photosensitive resin plate for printing plates. Alternatively, the photosensitive resin composition may be sandwiched between a support and a cover film such as those noted above, and pressed under heat until the photosensitive layer thus formed therebetween could have a predetermined thickness. In that manner, also produced is a photosensitive resin plate for printing plates. For the support, preferably used are metal sheets of steel, stainless steel, aluminium and the like, or plastic sheets of polyesters and others, or synthetic rubber sheets of styrene-butadiene rubber and others. Preferably, the thickness of the photosensitive layer formed falls from 0.01 to 10 mm. If the thickness is smaller than 0.01 mm, when such a thin photosensitive layer is patterned, the relief depth will be unsatisfactory for flexographic printing plates. If, on the other hand, the thickness of the photosensitive layer is larger than 10 mm, the plate material is too heavy and will lose its practical application for printing plates.

To form a relief image for printing on the photosensitive resin plate thus produced in the manner mentioned above, for example, the plate is first exposed to UV rays from a light source for UV rays having a wavelength of from 300 to 400 nm, such as a high-pressure mercury vapor lamp, a ultra-high-pressure mercury vapor lamp, a metal halide lamp, a xenon lamp, a carbon arc lamp, a chemical lamp or the like, with the light source being positioned at the support side of the plate; then the cover film is peeled off from the thus-exposed plate, and a negative or positive original image film is contacted with the photosensitive layer; and thereafter the photosensitive layer of the plate is again exposed to UV rays via the image film as contacted with it, whereby the layer is photo-cured through photopolymerization.

After thus processed, the plate is developed and rinsed with water in a spray-type developing device or a brush-type rinsing device to remove the non-polymerized part from the plate. In that manner, a relief image is formed on the support of the plate. The plate with the relief image is dried and then processed with actinic rays to be a printing plate.

The photosensitive resin composition of the invention is most suitable to flexographic printing plates, but may also be used for relief printing plates, lithographic printing plates, intaglio printing plates, mimeographic sheets, and photoresists.

The invention is described in more detail with reference to the following Examples, which, however, are not intended to restrict the scope of the invention.

SYNTHESIS EXAMPLE 1

Starting materials of 100 parts by weight of water, 0.2 parts by weight of sodium dodecylbenzenesulfonate, 3 parts by weight of polyoxyethylene nonylphenyl ether, 0.3 parts by weight of potassium persulfate, 0.2 parts by weight of t-dodecylmercaptan, 29 parts by weight of methyl methacrylate, 1 part by weight of methacrylic acid, and 70 parts by weight of butadiene were reacted at 50° C. for 20 hours to prepare a latex rubber dispersion in water, which had a number-average particle size of 140 nm, a glass transition temperature of −52° C. and a solid concentration of 50.5%.

SYNTHESIS EXAMPLE 2

Starting materials of 65 parts byweight of water, 1.3 parts by weight of disproportionated potassium rhodinate, 1.7 parts by weight of potassium oleate, 1.5 parts by weight of sodium alkylsulfonate, 0.05 parts by weight of t-dodecylmercaptan, 0.1 parts by weight of paramenthane hydroperoxide, 0.003 parts by weight of iron sulfate, 0.006 parts by weight of sodium ethylenediaminetetraacetate, 0.005 parts by weight of sodium formaldehyde sulfoxylate, 1.2 parts by weight of potassium sulfate and 100 parts by weight of butadiene were reacted for low-temperature polymerization at a polymerization temperature of 5° C. The degree of polymerization conversion was about 60%. A latex rubber dispersion in water was obtained, which had a number-average particle size of 350 nm and a solid concentration of 55%.

SYNTHESIS EXAMPLE 3

The same process as in Synthesis Example 1 was repeated, except that 50 parts by weight of methyl methacrylate and 50 parts by weight of butadiene were used, to prepare a latex rubber dispersion in water, which had a number-average particle size of 160 nm, a glass transition temperature of −27° C. and a solid concentration of 50.0%.

SYNTHESIS EXAMPLE 4

The same process as in Synthesis Example 1 was repeated, except that 24 parts by weight of methyl methacrylate, 1 part by weight of acrylic acid in place of the methacrylic acid, and 75 parts by weight of butadiene were used, to prepare a latex rubber dispersion in water, which had a number-average particle size of 180 nm and a solid concentration of 50.5%.

EXAMPLE 1

33.6 parts by weight (17 parts by weight in terms of the solids content) of the latex dispersion in water as prepared in Synthesis Example 1 and 14.5 parts by weight (8 parts by weight of the of the solids content) of the latex dispersion in water as prepared in Synthesis Example 2, both containing the component (A), were previously mixed with 16 parts by weight of phenoxypolyethylene glycol acrylate and 14 parts by weight of a polycondensate of glycerin polyether-polyol, succinic anhydride and 2-hydroxyethyl acrylate, the two constituting the component (B), and then dewatered in a drier at 120° C. for 2 hours to prepare a mixture serving as the component (E). On the other hand, 20 parts by weight of polybutadiene rubber (Nipol 1220L from Nippon Zeon) and 20 parts by weight of nitrile rubber (Nipol 1042 from Nippon Zeon), the two constituting the component (C), were kneaded in a 200-ml laboratory kneader mill (from Toshin) at 140° C. for 10 minutes. After this, the component (E) was put into the laboratory kneader mill, in which the components were further kneaded for 10 minutes. Next, 1 part by weight of a photopolymerization initiator of being the component (D), 2 parts by weight of dioctyl phthalate serving as a plasticizer, and 0.1 parts by weight of hydroquinone monomethyl ether serving as a polymerization inhibitor were put into the mill, in which all were still further kneaded for 5 minutes to give a photosensitive resin composition.

The resulting photosensitive resin composition was sandwiched between a substrate (support) of a 125 μm-thick polyethylene terephthalate film coated with a polyester-type adhesive, and a cover film of a 100 μm-thick polyethylene terephthalate film coated with a polyvinyl alcohol-based polymer, and so pressed with a presser heated at 150° C. that the layer of the photosensitive resin composition could have a thickness of 3 mm. In that manner, obtained was a photosensitive resin printing plate.

The photosensitive resin printing plate was exposed to light in an exposing device having fifteen 20-W chemical lamps disposed therein in parallel. Briefly, the plate was so set in the device that its support faced the lamps via a space of 15 cm therebetween, and was exposed to the light from the lamps for 1 minute. Next, the cover film was peeled off from the plate, and a negative film for image reproducibility evaluation (having 150 lines with 3% dots, independent dots of 200 μm in diameter and fine lines of 50 μm in width) was airtightly contacted with the photosensitive resin layer formed on the plate. In that condition, the plate was again exposed to the same chemical lamps for 10 minutes. After exposed in that manner, the plate was developed in a brush-type washer filled with water (liquid temperature: 40° C). Having been thus washed for 9 minutes, the plate had a relief image of 700 μm in depth. This was then dewatered in a drier at 60° C. Next, this was subjected to post-exposure to actinic rays to be a printing plate. The image formed on the printing plate was visually checked. It was found that the image formed on the printing plate was faithful to the original image of the negative film.

The printing plate had a degree of resiliency of 32%, a degree of swelling with water of 1.8%, and a Shore A hardness of 57.

The printing plate was installed in a flexographic printing machine in which was used an aqueous ink, and subjected to a printing test to duplicate 100,000 copies. The copies were all good. Briefly, the copies duplicated were compared with the original image in the negative film, and checked as to whether or not they were faithful to the original image. Those having a faithful image were judged good.

The composition for the printing plate is shown in Table 1. The developing speed, the image reproducibility, the degree of swelling with water, the Shore A hardness, the degree of resiliency, and the flexographic printing test data are in Table 2.

TABLE 1

| | Component (A) | | Component (B) | | Component (C) | | Component (D) | | Others | |
|---|---|---|---|---|---|---|---|---|---|---|
| Example 1 | Synthesis Example 1: | 17 | Monomer 1: | 16 | BR: | 20 | Initiator: | 1 | MEHQ: | 0.1 |
| | Synthesis Example 2: | 8 | Monomer 2: | 14 | NBR1: | 20 | | | | |
| Example 2 | Synthesis Example 1: | 22 | Monomer 1: | 34 | BR: | 10 | Initiator: | 1 | MEHQ: | 0.1 |
| | | | Monomer 2: | 5 | NBR1: | 24 | | | | |
| Example 3 | Synthesis Example 3: | 22 | Monomer 1: | 20 | NBR2: | 20 | Initiator: | 1 | MEHQ: | 0.1 |
| | | | Monomer 3: | 18 | NBR3: | 20 | | | | |

TABLE 1-continued

| | Component (A) | | Component (B) | | Component (C) | | Component (D) | | Others | |
|---|---|---|---|---|---|---|---|---|---|---|
| Example 4 | Synthesis Example 1: | 17 | Monomer 1: | 16 | BR: | 20 | Initiator: | 1 | MEHQ: | 0.1 |
| | Synthesis Example 2: | 8 | Monomer 2: | 14 | NBR3: | 20 | | | | |
| Example 5 | Synthesis Example 2: | 8 | Monomer 1: | 17 | BR: | 12 | Initiator: | 1 | MEHQ: | 0.1 |
| | Synthesis Example 4: | 17 | Monomer 2: | 16 | NBR2: | 36 | | | | |
| | | | | | NBR3: | 4 | | | | |
| Example 6 | Synthesis Example 1: | 17 | Monomer 1: | 10 | BR: | 13 | Initiator: | 1 | MEHQ: | 0.1 |
| | Synthesis Example 2: | 8 | Monomer 2: | 10 | NBR2: | 25 | | | | |
| | | | | | NBR3: | 13 | | | | |
| Example 7 | Synthesis Example 1: | 17 | Monomer 1: | 16 | BR: | 12 | Initiator: | 1 | MEHQ: | 0.1 |
| | Synthesis Example 2: | 8 | Monomer 2: | 14 | NBR2: | 24 | | | | |
| | | | | | NBR3: | 4 | | | | |
| Comparative Example 1 | None | | Monomer 1: | 16 | BR: | 20 | Initiator: | 1 | MEHQ: | 0.1 |
| | | | Monomer 2: | 14 | NBR1: | 20 | | | | |
| Comparative Example 2 | Synthesis Example 1: | 17 | None | | BR: | 20 | Initiator: | 1 | MEHQ: | 0.1 |
| | Synthesis Example 2: | 8 | | | NBR1: | 20 | | | Monomer 4: | 30 |
| Comparative Example 3 | Synthesis Example 1: | 17 | Monomer 1: | 16 | BR: | 20 | Initiator: | 1 | MEHQ: | 0.1 |
| | Synthesis Example 2: | 8 | Monomer 2: | 14 | NBR1: | 20 | | | | |

The amounts are all by weight, but the amount of the monomers for the component (B) is in terms of the solids content by weight.

Abbreviations are as follows:

| | |
|---|---|
| BR: | Butadiene rubber (Nipol 1220L from Nippon Zeon) |
| NBR1: | Nitrile rubber (Nipol 1042 from Nippon Zeon) |
| NBR2: | Partially crosslinked nitrile rubber (Nipol DN214 from Nippon Zeon) |
| NBR3: | Carboxylated NBR (Nipol 1072 from Nippon Zeon) |
| Monomer 1: | Phenoxydiethylene glycol acrylate |
| Monomer 2: | Polycondensate of glycerin polyether polyol, succinic anhydride and 2-hydroxyethyl acrylate |
| Monomer 3: | Nonylphenyltetraethylene glycol methacrylate |
| Monomer 4: | Lauryl acrylate |
| Initiator: | Benzyldimethyl ketal |
| MEHQ: | Hydroquinone monomethyl ether |

EXAMPLES 2 TO 7, AND COMPARATIVE EXAMPLES 1 AND 2

Using the compositions indicated in Table 1, printing plate materials were produced in the same manner as in Example 1. These were exposed and developed also in the same manner as in Example 1 to have a relief depth of about 700 μm. As in Example 1, the developing speed, the image reproducibility, the degree of swelling with water, the Shore A hardness, the degree of resiliency, and the flexographic printing test data are shown in Table 2.

COMPARATIVE EXAMPLE 3

The same components as in Example 1 were used to prepare a photosensitive resin composition. However, the method for preparing it differs from that in Example 1, and is as follows: A laboratory kneader mill (from Toshin) was heated at 140° C. The component (C) was put into this, and kneaded for 10 minutes. The latex dispersion (A') prepared in Synthesis Example 1 and serving as the component (A') was previously dewatered in a drier, then put into the mill, and kneaded therein. The latex dispersion (A') prepared in Synthesis Example 2 and serving as the component (A') was also dewatered, put into the mill and kneaded therein in the same manner. Next, the two monomers serving as the component (B) were pre-mixed, and the resulting liquid mixture was put into the mill and kneaded. In the initial stage of the process, the components slipped in the mill and could not be kneaded well, but, after a while, they were well kneaded. Last, the component (D) and the additive were added to the mill and further kneaded to prepare a photosensitive resin composition.

Using the composition, a photosensitive resin plate was produced in the same manner as in Example 1. The plate was exposed and developed also in the same manner as in Example 1 to be a printing plate.

After developed, the surface of the printing plate was observed. Many gel particles existed on the surface of the plate, though washed through development. It is believed that the latex polymer as separated from its aqueous dispersion would aggregate to give the gels since it was dried prior to being mixed with the other components. In the relief pattern formed, the gel particles partly dropped off, and the relief pattern was not faithful to the original image in the negative film.

TABLE 2

| | Developing Speed (μm/min) | Hardness (Shore A) | Degree of Resiliency (%) | Image Reproducibility | Degree of Swelling with Water (%) | Printability |
|---|---|---|---|---|---|---|
| Example 1 | 78 | 57 | 32 | Good | 1.8 | Good |
| Example 2 | 197 | 51 | 38 | Good | 2.6 | Good |
| Example 3 | 74 | 32 | 37 | Good | 1.0 | Good |
| Example 4 | 73 | 50 | 32 | Good | 1.5 | Good |
| Example 5 | 223 | 56 | 30 | Good | 1.9 | Good |
| Example 6 | 7 | 46 | 33 | Good | 1.4 | Good |

TABLE 2-continued

|  | Developing Speed (μm/min) | Hardness (Shore A) | Degree of Resiliency (%) | Image Reproducibility | Degree of Swelling with Water (%) | Printability |
|---|---|---|---|---|---|---|
| Example 7 | 105 | 57 | 33 | Good | 1.7 | Good |
| Comparative Example 1 | Poorly kneaded. | | | | | |
| Comparative Example 2 | Water development impossible. | | | | | |
| Comparative Example 3 | Gel particles existed, relief reproducibility not good. | | | | | |

Hardness:

Measured at room temperature (25° C.).

Degree of resiliency:

An iron ball weighing 5.8 g was dropped down onto the printing plate. The ratio by percentage of the rebounded height to the dropping height indicates the degree of resiliency.

Image Reproducibility:

Good: Faithful to the original image of the negative film.

Poor: Not faithful to the original image of the negative film.

Degree of Swelling in Water:

Weight increase after immersed in water for 24 hours.

Printability:

Good: After the printing test, the relief edges and the surface of the printing plate did not change.

Poor: After the printing test, the relief edges of the printing plate were partly broken and the surface thereof was roughened.

Morphology Observation:

The photosensitive resin-coated printing plate material having been produced in Example 7 was exposed to the same chemical lamps as those used in Example 1. First, the printing plate was exposed for 5 minutes at the support side, then the cover film was peeled off, and the plate was again exposed for 10 minutes at the side of the resin layer. The thus-exposed resin layer was sliced into sections having a thickness of about 200 nm, according to a method of freezing and slicing ultra-thin film sections. The sections were observed with a transmission electron microscope (H-600 Model made by Hitachi, Ltd.) to identify the morphology of the cured resin composition. FIG. 1 shows the TEM image (×40,000) of the exposed resin composition.

As seen in the TEM image, the polymer particles of the component (A) derived from the latex dispersion in water (these particles are seen as spheres of about 200 nm in size) are dispersed in the hydrophilic monomer of the component (B) (this is seen as the white background area).

In the resin composition, the structure moiety with the component (A) being dispersed in the component (B) is hydrophilic. As having the hydrophilic structure moiety, the resin composition could be developed with water.

While the invention has been described in detail and with reference to specific embodiments thereof, it will be apparent to one skilled in the art that various changes and modifications can be made therein without departing from the spirit and scope thereof.

What is claimed is:

1. A photosensitive resin composition comprising a dispersion of a polymer, having no or a low intragranular cross-linking density, as derived from its latex dispersion in water, in (B) a hydrophilic photopolymerizable monomer capable of inhibiting aggregation of said polymer (A), (C) rubber, and (D) a photopolymerization initiator.

2. The photosensitive resin composition as claimed in claim 1, wherein the amount of the component (B) falls between 10 and 200 parts by weight, that of the component (C) falls from 20 to 300 parts by weight and that of the component (D) falls from 0.1 to 50 parts by weight, each relative to 100 parts by weight of the component (A).

3. The photosensitive resin composition as claimed in claim 1, wherein the ratio by weight of the total of the component (A) and the component (B) to the component (C) is at least 1.

4. The photosensitive resin composition as claimed in claim 1, wherein the polymer of the component (A) has a butadiene or isoprene skeleton in its molecular chain.

5. The photosensitive resin composition as claimed in claim 1, wherein the polymer of the component (A) is at least one polymer or copolymer selected from the group consisting of polybutadiene, styrene-butadiene copolymer, acrylonitrile-butadiene copolymer, methyl methacrylate-butadiene copolymer, polyisoprene, and copolymers of these with other polymerizable monomers.

6. The photosensitive resin composition as claimed in claim 1, wherein the hydrophilic photopolymerizable monomer of the component (B) is at least one monomer selected from the group consisting of a monomer having polyalkylene glycol in its molecular structure, a monomer having carboxyl groups, a monomer having hydroxyl groups and a monomer having phosphoric acid groups.

7. A printing plate material comprising a photosensitive layer as formed on a support by applying the photosensitive resin composition of any one of claims 1 to 6 onto the support.

8. A photosensitive resin composition comprising (A) a polymer as derived from its latex dispersion in water, (B) a hydrophilic photopolymerizable monomer, (C) rubber, and (D) a photopolymerization initiator.

9. The photosensitive resin composition as claimed in claim 8, wherein the amount of the component (B) falls between 10 and 200 parts by weight, that of the component (C) falls from 20 to 300 parts by weight and that of the component (D) falls from 0.1 to 50 parts by weight, each relative to 100 parts by weight of the component (A).

10. The photosensitive resin composition as claimed in claim 8, wherein the ratio by weight of the total of the component (A) and the component (B) to the component (C) is at least 1.

11. The photosensitive resin composition as claimed in claim 8, wherein the polymer of the component (A) has a butadiene or isoprene skeleton in its molecular chain.

12. The photosensitive resin composition as claimed in claim 8, wherein the polymer of the component (A) is at least one polymer or copolymer selected from the group consisting of polybutadiene, styrenebutadiene copolymer, acrylonitrile-butadiene copolymer, methyl methacrylate-butadiene copolymer, polyisoprene, and copolymers of these with other polymerizable monomers.

13. The photosensitive resin composition as claimed in claim 8, wherein the hydrophilic photopolymerizable monomer of the component (B) is at least one monomer selected from the group consisting of a monomer having polyalkylene glycol in its molecular structure, a monomer having carboxyl groups, a monomer having hydroxyl groups and a monomer having phosphoric acid groups.

14. A printing plate material comprising a photosensitive layer as formed on a support by applying the photosensitive resin composition of any one of claims 8 to 13 onto the support.

15. A method for producing a photosensitive resin composition, which comprises mixing (A') a latex dispersion in water and (B) a hydrophilic photopolymerizable monomer to give a component (E), followed by kneading under heat the resulting component (E) with (C) rubber and (D) a photopolymerization initiator.

16. The method for producing a photosensitive resin composition as claimed in claim 15, wherein the component (E) is dewatered, and the resulting dry component (E) is kneaded under heat with the component (C) and the component (D).

17. A printing plate material comprising a photosensitive layer as formed on a support by applying the photosensitive resin composition having been prepared in the production method of claim 15 or 16, onto the support.

* * * * *